(12) United States Patent
Joo et al.

(10) Patent No.: US 9,236,303 B2
(45) Date of Patent: Jan. 12, 2016

(54) SUBSTRATE FILM AND METHOD OF MANUFACTURING THE SAME

(71) Applicant: LG CHEM, LTD., Seoul (KR)

(72) Inventors: Hyo Sook Joo, Daejeon (KR); Se-Ra Kim, Daejeon (KR); Jung Sup Shim, Daejeon (KR); Suk Ky Chang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/967,060

(22) Filed: Aug. 14, 2013

(65) Prior Publication Data

US 2014/0045319 A1 Feb. 13, 2014

Related U.S. Application Data

(63) Continuation of application No. PCT/KR2012/001111, filed on Feb. 14, 2012.

(30) Foreign Application Priority Data

Feb. 14, 2011 (KR) .................. 10-2011-0012989
Feb. 14, 2012 (KR) .................. 10-2012-0014775

(51) Int. Cl.
*H01L 21/00* (2006.01)
*H01L 21/78* (2006.01)
(Continued)

(52) U.S. Cl.
CPC .............. *H01L 21/78* (2013.01); *B29C 39/006* (2013.01); *C08F 8/10* (2013.01); *C08F 20/18* (2013.01);
(Continued)

(58) Field of Classification Search
CPC ..... H01L 21/78; H01L 21/6836; C08F 20/18; C09J 7/02; C09J 7/0203; C09J 7/0207
USPC ............. 438/460, 464, 465; 428/40.1, 355 R; 522/8
See application file for complete search history.

(56) References Cited

U.S. PATENT DOCUMENTS 4,818,621 A * 4/1989 Kuroda et al. ............. 428/424.6
4,877,818 A 10/1989 Emmons et al.
(Continued)

FOREIGN PATENT DOCUMENTS

CN 101186127 A 5/2008
EP 0590573 A2 4/1994
(Continued)

OTHER PUBLICATIONS

International Search Report issued in International Application No. PCT/KR2012/001111 dated Sep. 27, 2012, 2 pages.
(Continued)

*Primary Examiner* — Brook Kebede
(74) *Attorney, Agent, or Firm* — Rothwell, Figg, Ernst & Manbeck, P.C.

(57) ABSTRACT

Provided are a substrate film and a method of manufacturing the substrate film. The substrate film may have excellent thermal resistance and dimensional stability, has excellent stress relaxation to prevent damage of a wafer caused by remaining stress, inhibits damage to or flying-off of the wafer caused by application of a non-uniform pressure during the processing of the wafer, and has excellent cuttability. Accordingly, the substrate film of the present invention can be effectively used as a processing sheet in a process of processing various kinds of wafers including dicing, back-grinding or picking-up.

24 Claims, 1 Drawing Sheet

(51) Int. Cl.
*C08F 8/10* (2006.01)
*C09J 133/06* (2006.01)
*C08F 20/18* (2006.01)
*H01L 21/683* (2006.01)
*C09J 7/02* (2006.01)
*B29C 39/00* (2006.01)
*C08G 18/62* (2006.01)
*C08G 18/81* (2006.01)
*C09J 175/16* (2006.01)

(52) U.S. Cl.
CPC ........ *C08G 18/6229* (2013.01); *C08G 18/8116* (2013.01); *C09J 7/0267* (2013.01); *C09J 133/066* (2013.01); *C09J 175/16* (2013.01); *H01L 21/6836* (2013.01); *C09J 2201/606* (2013.01); *C09J 2203/326* (2013.01); *C09J 2433/006* (2013.01); *H01L 2221/6834* (2013.01); *H01L 2221/68327* (2013.01); *Y10T 428/2809* (2015.01)

(56) References Cited

U.S. PATENT DOCUMENTS

2003/0059547 A1 3/2003 Rihan et al.
2008/0131634 A1* 6/2008 Kiuchi et al. ................ 428/34.9
2011/0018127 A1 1/2011 Lee et al.

FOREIGN PATENT DOCUMENTS

| EP | 0991014 B1 | 11/2005 |
| KR | 10-1986-0002735 A | 4/1986 |
| KR | 10-0629923 B1 | 9/2006 |

OTHER PUBLICATIONS

First Office Action issued Mar. 10, 2015, CN 201280018385.3 along with its English translation, 12 pages.

* cited by examiner

SUBSTRATE FILM AND METHOD OF MANUFACTURING THE SAME

CROSS REFERENCE TO RELATED APPLICATIONS

The present application is a continuation of International Application No. PCT/KR2012/001111 filed on Feb. 14, 2012, which claims priority to and the benefit of Korean Patent Application No. 10-2011-0012989 filed on Feb. 14, 1011 and of Korean Patent Application No. 10-2012-0014775 filed on Feb. 14, 2012, the disclosures of which are incorporated herein by reference in their entireties.

TECHNICAL FIELD

The present invention relates to a substrate film and a method of manufacturing the same, a pressure-sensitive adhesive sheet for processing a wafer including the substrate film, and a method of processing a wafer using the same.

BACKGROUND ART

A process of manufacturing a semiconductor device includes a back-grinding or dicing process, and uses a pressure-sensitive adhesive sheet such as a wafer surface protective sheet or a dicing sheet.

Recently, according to the increasing demands for smaller and lighter semiconductor devices, performance of such a pressure-sensitive adhesive sheet for processing a wafer becomes more important.

For example, to achieve a higher integration rate than a conventional method of forming a circuit only on one surface of a wafer, recently, there is an attempt to forming a circuit on both surfaces of the wafer. Likewise, to form circuits on both surfaces of the wafer, a high temperature process should be performed in a state in which a sheet for processing a wafer is attached. Accordingly, the sheet for processing a wafer needs excellent thermal resistance or dimensional stability at a high temperature. However, when a solid substrate having a high melting point is used to simply ensure the thermal resistance or dimensional stability, a function of protecting a wafer and stress relaxation are degraded, and thus the wafer may be damaged.

In addition, the substrate of the sheet for processing a wafer has excellent stress relaxation and no defect such as a fish eye. That is, when the stress relaxation is degraded or a protrusion is creased on the substrate, the wafer is probably damaged due to remaining stress or the application of a non-uniform pressure in the process. Such demands are higher according to the increase in demand for a large diameter wafer.

Moreover, the sheet for processing a wafer also needs excellent cuttability. When the cuttability is decreased, a cutting failure may be generated during the processing of the wafer, and in this case, the process of processing a wafer is discontinuously performed. Accordingly, when the cuttability of the sheet for processing a wafer is degraded, process efficiency may be degraded and the wafer may be damaged.

DISCLOSURE

Technical Problem

The present invention is directed to providing a substrate film, a method of manufacturing the same, a pressure-sensitive adhesive sheet for processing a wafer including the substrate film, and a method of processing a wafer.

Technical Solution

One aspect of the present invention provides a substrate film, which may be used as a substrate for various kinds of pressure-sensitive adhesive sheets used in wafer processing.

The substrate film according to an exemplary embodiment of the present invention includes a cured product of a solventless composition including a (meth)acrylic polymer component including a (meth)acrylic acid ester-based monomer as a polymerization unit and having a photoreactive group on a side chain or terminal end thereof; and a component of a monomer having a high glass transition temperature.

Such a substrate film has a glass transition temperature of −20° C. (250K) after curing, and a toughness of 10 kg·mm to 250 kg·mm at 23° C., which may provide suitable physical properties of a substrate film.

The substrate film may be used as a substrate film of a protective film to protect or fix a wafer.

The substrate film of the present invention may be manufactured by curing the solventless composition, which is suitable to manufacture a film requiring optical transparency, and/or having a large thickness but excellent thickness uniformity.

The composition which is cured to form a substrate film is solventless. The solventless composition refers to a composition not including a solvent such as an organic or aqueous solvent. As the substrate film is formed using the solventless composition, efficiency of the process of the manufacturing of the substrate film may be increased, and a uniform substrate film which does not have a substantial thickness deviation may be manufactured. In addition, as a solvent is excluded, generation of bubbles or degradation in leveling caused by volatilization of a solvent may be prevented, and in some cases, a substrate film having a large but uniform thickness may be effectively manufactured. In addition, since the volatilization of a solvent is not required, contamination may not occur during the process.

The solventless composition of the present invention includes a (meth)acrylic polymer component including a (meth)acrylic acid ester-based monomer as a polymerization unit, and having a photoreactive group on a side chain or terminal end thereof. Due to the photoreactive group, optical characteristics of the substrate film manufactured from the composition are enhanced, and physical properties are also enhanced as a gel fraction is increased.

In one example, the (meth)acrylic polymer component included in the solventless composition may be prepared by bulk polymerization, particularly partial polymerization according to the bulk polymerization. That is, a part of the monomers used in the bulk polymerization may remain in a state of an unreacted monomer. For example, the polymer component may include a bulk polymerization product of a monomer mixture including the (meth)acrylic acid ester-based monomer and a copolymerizable monomer having a first reactive group; and a compound bound with the first reactive group in the bulk polymerization product to provide a photoreactive group.

In one example, when the monomer mixture including the (meth)acrylic acid ester-based monomer and the copolymerizable monomer having the first reactive group is partially polymerized, some monomers included in the monomer mixture may be polymerized, thereby forming a polymer component, and the others may be included in the composition without being polymerized. In the present invention, as needed, after the bulk polymerization, a monomer may be further blended into the polymerization product.

The polymer component after the partial polymerization of the monomer mixture, includes a polymer component in which the (meth)acrylic acid ester-based monomer and the copolymerizable monomer having the first reactive group are copolymerized, and the first reactive group is present on the side chain or terminal end thereof. Accordingly, by introducing the photoreactive group by means of the first reactive group, the polymer component having a photoreactive group on the side chain or terminal end thereof may be prepared. Here, the photoreactive group may be introduced by a method of reacting a compound simultaneously having a functional group (hereinafter, also referred to as "second reactive group") capable of reacting with the first reactive group and a photoreactive group with the partial polymerization product of the bulk polymerization product.

The term "polymer component" used herein may refer to a high molecular weight component including at least two monomers in a polymerized form, for example, an oligomer or polymer component. In addition, the polymer component also includes a partially polymerized monomer, and it is understood that the component also includes an unreacted monomer component.

In addition, here, the photoreactive group may refer to all functional groups capable of being polymerized or crosslinked by electromagnetic radiation, and an example of the functional group may be, but is not limited to, a (meth)acryloyl group.

Here, the electromagnetic radiation may refer to microwaves, IR rays, UV rays, X rays, $\gamma$ rays, or a particle beam such as an $\alpha$-particle beam, a proton beam, a neutron beam, or an electron beam, and in one example, it may be UV rays. The solventless composition of the present invention may include a polymer component having a photoreactive group, thereby becoming a photocurable composition.

The (meth)acrylic acid ester-based monomer included in the monomer mixture may be, but is not particularly limited to, for example, a (meth)acrylic acid alkyl ester. The (meth) acrylic acid alkyl ester may include one or at least two of (meth)acrylic acid alkyl esters having carbon atoms 1 to 14 alkyl groups such as methyl(meth)acrylate, ethyl(meth)acrylate, n-propyl(meth)acrylate, isopropyl(meth)acrylate, n-butyl(meth)acrylate, t-butyl(meth)acrylate, sec-butyl(meth) acrylate, pentyl(meth)acrylate, 2-ethylbutyl(meth)acrylate, 2-ethylhexyl(meth)acrylate, n-octyl(meth)acrylate, isooctyl (meth)acrylate, isononyl(meth)acrylate, lauryl(meth)acrylate, and tetradecyl(meth)acrylate. In addition, as the (meth) acrylic acid ester-based monomer, a monomer having a high glass transition temperature such as isobornyl acrylate may be included.

In addition, here, the copolymer monomer having a first reactive group may be, for example, a monomer capable of being copolymerized with the (meth)acrylic acid ester-based monomer, which may provide a first reactive group to a side chain or terminal end of a polymer after polymerization. Such a first reactive group may be, but is not limited to, at least one selected from the group consisting of a hydroxyl group, a carboxyl group, an isocyanate group, an amino group, and an epoxy group, and in one exemplary embodiment of the present invention, the first reactive group may be a hydroxyl group or a carboxyl group, but the present invention is not limited thereto. In the art, various monomers copolymerized with a (meth)acrylic acid ester-based monomer, thereby providing such a reactive group to the polymer are known, and may be used without limitation. For example, a copolymerizable monomer having a hydroxyl group as a first reactive group may be 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 2-hydroxyethyleneglycol (meth)acrylate, or 2-hydroxypropyleneglycol (meth)acrylate, and a copolymerizable monomer having a carboxyl group as a first reactive group may be (meth)acrylic acid, 2-(meth)acryloyloxy acetic acid, 3-(meth)acryloyloxy propylic acid, 4-(meth)acryloyloxy butyric acid, acrylic acid dimer, itaconic acid, maleic acid, or maleic anhydride.

The monomer mixture may include, for example, 70 to 99 parts by weight of a (meth)acrylic acid ester-based monomer and 1 to 30 parts by weight of a copolymerizable monomer having a first reactive group. The unit "parts by weight" used herein is a weight ratio. By controlling the weight ratio between the monomers as described above, curability of the composition may be excellently maintained, and a phenomenon of decreasing transparency of the composition or a cured product thereof due to phase separation occurring in the composition may be prevented.

In the monomer mixture, at least one (meth)acrylic ester-based monomer may be used, and particularly, in the solventless composition of the present invention, a predetermined content of the monomer (e.g., isobornyl acrylate, methylmethacrylate, etc.) having a high glass transition temperature may be included in the (meth)acrylic polymer. Here, the (meth)acrylic acid ester-based monomer having a high glass transition temperature may be included at 10 to 60 parts by weight, relative to 100 parts by weight of the monomer mixture.

The monomer mixture may further include another functional monomer besides the above-described monomer as needed. Such a functional monomer may be added to control physical properties such as a glass transition temperature of the composition or a cured product thereof or to provide other functionalities, and may be, for example, a nitrogen-containing monomer such as acrylonitrile, (meth)acrylamide, N-methyl(meth)acrylamide, or N-butoxy methyl(meth)acrylamide; an aromatic group-containing monomer such as styrene, methyl styrene, benzyl(meth)acrylate, or phenoxyethyl(meth)acrylate; a carboxylic acid vinyl ester such as vinyl acetate; an alkoxy group-containing monomer such as 2-(2-ethoxyethoxy)ethyl(meth)acrylate; or a heterocyclic residue-containing monomer such as tetrahydrofurfuryl (meth)acrylate or (meth)acryloyl morpholine. Such a monomer may be included in the monomer mixture in a suitable ratio according to a desired use.

In addition, when the monomer mixture is partially polymerized, a degree of partial polymerization is not particularly limited, and may be controlled according to a purpose. For example, the degree of partial polymerization may be controlled in a range capable of satisfying the following viscosity range.

A compound providing a photoreactive group to a polymer component may be bound to the first reactive group, and may be a compound simultaneously including a second functional group capable of binding to the first reactive group and the photoreactive group. Here, examples of the second reactive group may include, but are not limited to, an isocyanate group, an epoxy group, a silane group, and a carboxyl group. For example, when the first reactive group is a hydroxyl group or a carboxyl group, the second reactive group may be an isocyanate group, an epoxy group, or a halosilane group, when the first reactive group is an amino group, the second reactive group may be an isocyanate group, and when the first reactive group is an epoxy group, the second reactive group may be a carboxyl group.

In one example, as described above, the compound including a second reactive group to provide a photoreactive group to the polymer component may be one or at least two compounds of a compound represented by Formula 1; a compound represented by Formula 2; a compound represented by Formula 3; a reaction product of a multifunctional isocyanate compound and a compound represented by Formula 4; and a reaction product of a multifunctional isocyanate compound, a polyol compound, and the compound of Formula 4.

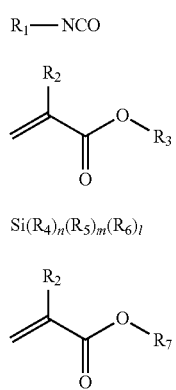

[Formula 1]

[Formula 2]

[Formula 3]

[Formula 4]

In Formulas 1 to 4, $R_1$ is an alkyl group substituted with a (meth)acryloxy group; an alkyl group substituted with a (meth)acryloxyalkyl group; an alkyl group substituted with an alkenylphenyl group; a (meth)acryloyl group; a (meth)acryloxy group; or an alkenyl group, $R_2$ is a hydrogen or an alkyl group, $R_3$ is a hydrogen or a glycidyl group, $R_4$ is a (meth)acryloxyalkyl group, $R_5$ is a halogen atom, $R_6$ is an alkyl group, n+m+1 is 4, n and m are each independently 1 to 3, and $R_7$ is a hydroxyalkyl group.

In the definitions of Formulas 1 to 4, the alkyl group may be an alkyl group having 1 to 20, 1 to 16, 1 to 12, 1 to 8, or 1 to 4 carbon atoms, the alkenyl group may be an alkenyl group having 2 to 20, 2 to 16, 2 to 12, 2 to 8, or 2 to 4 carbon atoms, for example, a vinyl group, an allyl group, or an isoprophenyl group, and the halogen atom may be, for example, a chlorine atom.

Specifically, the compound may be, but is not limited to, one or at least two of 2-isocyanatoethyl(meth)acrylate, 1,1-bis(acryloyloxymethyl)ethyl isocyanate, (meth)acryloyloxy ethyl isocyanate, meth-isoprophenyl-α,α-dimethylbenzyl-isocyanate, methacryloyl isocyanate; vinyl isocyanate; allyl isocyanate; an acryloyl monoisocyanate compound obtained by reacting a diisocyanate compound or a polyisocyanate compound with (meth)acrylic acid 2-hydroxyethyl; an acryloyl monoisocyanate compound obtained by reacting a diisocyanate compound or polyisocyanate compound, a polyol compound, and (meth)acrylic acid 2-hydroxyethyl; (meth) acrylic acid glycidyl; (meth)acrylic acid; and 3-methacryloxypropyldimethylchlorosilane.

Such a compound may be included in a ratio of 1 to 200 equivalent weight, relative to 100 equivalent weight of the first reactive group, so that the curability of the composition may be excellently maintained, and the phenomenon of decreasing transparency due to phase separation occurring in the composition may be prevented.

The solventless composition used in the manufacture of the substrate film of the present invention further includes a monomer component having a high glass transition temperature in addition to the (meth)acrylic polymer component to have physical properties of the substrate film after curing. That is, the composition may provide a cured product having a glass transition temperature of −20° C. (250K) after curing by further including a monomer component having a relatively high glass transition temperature in the (meth)acrylic polymer component having a relatively low glass transition temperature.

The monomer component having a high glass transition temperature may be a monomer having a glass transition temperature of 20° C. to 100° C., and the (meth)acrylic polymer component may have a glass transition temperature of −50° C. to 0° C.

The monomer component having a high glass transition temperature may be at least one selected from the group consisting of isobornyl acrylate, cyclohexyl acrylate, methyl methacrylate, and styrene.

The monomer component having a high glass transition temperature may be included at 35 to 300 or 50 to 200 parts by weight, relative to 100 parts by weight of the (meth)acrylic polymer component. By controlling the glass transition temperature of the monomer component as described above, the glass transition temperature of the substrate film, which is a cured product of the composition may be controlled.

The composition used to manufacture the substrate film of the present invention may further include a multifunctional acrylate or an acrylate-based oligomer. Such a component may be added to increase, for example, a crosslinking density of the cured product and control physical properties such as hardness, toughness, or glass transition temperature. The composition of the present invention may include a polymer component having a photoreactive group on a side chain or terminal end thereof, and therefore even when a component having at least two double bonds in the molecule like the multifunctional acrylate or acrylate oligomer is further blended, a problem caused by gelation or phase separation of the composition may not occur.

As the multifunctional acrylate, any one having at least two (meth)acryloyl groups in a molecule may be used without limitation. For example, the multifunctional acrylate may be, but is not limited to, a bifunctional acrylate such as 1,4-butanediol di(meth)acrylate, 1,6-hexanediol di(meth)acrylate, neopentylglycol di(meth)acrylate, polyethyleneglycol di(meth)acrylate, neopentylglycol adipate di(meth)acrylate, hydroxypivalic acid neopentylglycol di(meth)acrylate, dicyclopentanyl di(meth)acrylate, caprolactone-modified dicyclopentenyl di(meth)acrylate, ethyleneoxide-modified di(meth)acrylate, di(meth)acryloxy ethyl isocyanurate, allylated cyclohexyl di(meth)acrylate, tricyclodecanedimethanol (meth)acrylate, dimethylol dicyclopentane di(meth)acrylate, ethyleneoxide-modified hexahydrophthalic acid di(meth) acrylate, tricyclodecane dimethanol(meth)acrylate, neopentylglycol-modified trimethylpropane di(meth)acrylate, adamantane di(meth)acrylate, or 9,9-bis[4-(2-acryloyloxyethoxy)phenyl]fluorine; a trifunctional acrylate such as trimethylolpropane tri(meth)acrylate, dipentaerythritol tri(meth)acrylate, propionic acid-modified dipentaerythritol tri(meth)acrylate, pentaerythritol tri(meth)acrylate, propyleneoxide-modified trimethylolpropane tri(meth)acrylate, trifunctional urethane (meth)acrylate, or tris(meth)acryloxyethylisocyanurate; a tetrafunctional acrylate such as diglycerin tetra(meth)acrylate or pentaerythritol tetra(meth)acrylate; a pentafunctional acrylate such as propionic acid-modified dipentaerythritol penta(meth)acrylate; or a hexafunctional acrylate such as dipentaerythritol hexa(meth) acrylate, caprolactone-modified dipentaerythritol hexa (meth)acrylate, or urethane (meth)acrylate (e.g. a reaction product of an isocyanate monomer and trimethylolpropane tri(meth)acrylate).

In addition, as the acrylate oligomer, a conventional photoreactive oligomer known in the art such as urethane acrylate, polycarbonate acrylate, ester acrylate, ether acrylate, or epoxy acrylate may be used, but the present invention is not limited thereto.

The multifunctional acrylate or acrylate oligomer may be included in the composition at 500 or less, or 0.5 to 300 parts by weight, relative to 100 parts by weight of the above-described (meth)acrylic polymer component, and as needed, the content may be changed according to process efficiency or physical properties of a desired film.

The composition of the present invention may further include a photoinitiator, and a polymerization degree may be controlled according to an amount of the photoinitiator used. As the photoinitiator, any one capable of initiating a polymerization, crosslinking, or curing reaction may be used without limitation.

A kind of the photoinitiator is not particularly limited, and may be, but is not limited to, for example, an α-hydroxyketone-based compound (e.g., IRGACURE 184, IRGACURE 500, IRGACURE 2959, or DAROCUR 1173; Ciba Specialty Chemicals); a phenylglyoxylate-based compound (e.g., IRGACURE 754, DAROCUR MBF; Ciba Specialty Chemicals); a benzyldimethylketal-based compound (e.g., IRGACURE 651; Ciba Specialty Chemicals); an α-aminoketone-based compound (e.g., IRGACURE 369, IRGACURE 907. IRGACURE 1300; Ciba Specialty Chemicals); a monoacylphosphine-based compound (MAPO) (e.g., DAROCUR TPO; Ciba Specialty Chemicals); a bisacylphosphene-based compound (BAPO) (e.g., IRGACURE 819, IRGACURE 819DW1; Ciba Specialty Chemicals); a phosphineoxide-based compound (e.g., IRGACURE 2100; Ciba Specialty Chemicals); a metalocene-based compound (e.g., IRGACURE 784; Ciba Specialty Chemicals); an iodonium salt (e.g., IRGACURE 250; Ciba Specialty Chemicals); and a mixture of at least one thereof (e.g., DAROCUR 4265, IRGACURE 2022, IRGACURE 1300, IRGACURE 2005, IRGACURE 2010, IRGACURE 2020; Ciba Specialty Chemicals), which may be used alone or in combination of at least two thereof.

In the present invention, the photoinitiator may be included at 0.01 to 20 parts by weight, relative to 100 parts by weight of the (meth)acrylic polymer component described above, but may be changed in consideration of a process efficiency or physical properties of the cured product.

The composition may further include at least one additive selected from the group consisting of a dye, a pigment, an epoxy resin, a crosslinking agent, a UV stabilizer, an antioxidant, a coloring agent, a reinforcing agent, a filler, a foaming agent, a surfactant, a photo thickening agent, and a plasticizer as needed.

The solventless composition used to manufacture a substrate film of the present invention may have a viscosity of 500 cps to 30,000 cps or 800 cps to 20,000 cps at 25° C. By controlling the viscosity of the composition in the above range, the process efficiency and the physical properties after curing may be effectively maintained.

In the present invention, the substrate film formed by curing the composition may have a gel fraction of 80% to 100% or 90% to 100%. Here, the after-curing state refers to a state in which the composition of the present invention is manufactured in the substrate film through light radiation. In addition, the gel fraction may be measured by Equation 1:

$$\text{Gel fraction (\%)} = B/A \times 100 \qquad \text{[Equation 1]}$$

In Equation 1, A is a weight of the composition after curing, and B is a dry weight of an insoluble content when the composition after curing is precipitated in ethyl acetate for 48 hours at room temperature.

In the present invention, by controlling the gel fraction as described above, a physical property such as thermal resistance of the substrate film may be excellently maintained.

The substrate film according to exemplary embodiments of the present invention may have a glass transition temperature (Tg) of −20° C. to 45° C., for example, −20° C. to 40° C., −20° C. to 0° C., −10° C. to 40° C., −5° C. to 40° C., 0° C. to 35° C., or 0° C. to 30° C.

The glass transition temperature may be measured using a differential scanning calorimeter (DSC). In addition, in the present invention, when at least two glass transition temperatures are measured in the DSC measurement, an average value considering each component of the composition is determined a representative value of the glass transition temperature. By controlling the glass transition temperature of the substrate film as described above, stress relaxation and wafer conformability may be excellently maintained.

In addition, the substrate film may have a toughness of 10 Kg·mm to 250 Kg·mm at 15° C. to 30° C. In other exemplary embodiments, the toughness at 15° C. to 30° C. may be 10 Kg·mm to 200 Kg·mm, 10 Kg·mm to 150 Kg·mm, or 25 Kg·mm to 150 Kg·mm, and may be at 20° C. to 25° C. or 23° C. The toughness may be measured by a tensile test. For example, the substrate film is cut as a sample formed in a film type having a length of 15 mm and a width of 15 mm. Here, a size of the sample means a size of a part excluding a taping part of the sample to be fixed to a tensile tester during the tensile test. After the sample is prepared, it is fixed to the tester to match the length direction of the sample in a tensile direction of the tensile tester, and is extended in a vertical direction at a measurement temperature at a rate of 180 mm/min to 220 mm/min, and preferably 200 mm/min, and then a force according to a distance until the sample is broken is measured to draw a graph. In the drawn graph, an area of the toughness curve may be integrated, thereby measuring a tensile value. When the toughness is less than 10 Kg·mm, the substrate film may be excessively rigid, or difficult to be formed as a substrate. In addition, when the toughness is more than 250 Kg·mm, a characteristic such as cuttability may be degraded.

In addition, the substrate film may have a modulus of 10 MPa to 200 MPa. The modulus is a value corresponding to an initial slope of the tensile curve in the tensile test. When the modulus is less than 10 MPa, the substrate film may not properly function, and when the modulus is more than 200 MPa, the stress relaxation and wafer conformability are degraded.

The substrate film may be manufactured by the following method.

Another aspect of the present invention provides a method of manufacturing the substrate film according to an exemplary embodiment, which includes casting a solventless composition including a (meth)acrylic acid ester-based monomer as a polymerization unit, and including a (meth)acrylic polymer component having a photoreactive group on a side chain or terminal end thereof and a component of the monomer having a high glass transition temperature; and curing the casted solventless composition.

That is, in the present invention, the solventless composition including the components described above is formed in a film by a casting method, and cured, thereby forming a substrate film. As the substrate film is manufactured in the method as described above, protrusion such as a fish eye on the substrate film may be prevented, and the substrate film may have a uniform thickness.

The substrate film of the present invention may have a thickness of 40 μm to 300 μm, but the present invention is not limited thereto.

Particularly, when the substrate film according to the present invention is applied to wafer processing, cracking and flying off of the wafer due to non-uniform pressure may be inhibited. In addition, by forming the substrate film in the above-described method, the cuttability of the substrate and stress relaxation may be optimized. In addition, in such a method, due to a minimized stress applied to the substrate film in a curing process, the substrate film may have uniform physical properties in an axis direction, and thus a contraction or expansion behavior of the substrate film may be stabilized. In addition, due to the use of the characteristic solventless composition, the substrate film may have excellent physical properties such as thermal resistance, dimensional stability, and cuttability required for the substrate for processing a wafer.

In one example, the solventless composition used in the manufacture of the substrate film of the present invention may be prepared by the following method.

That is, the method may include preparing a bulk polymerization product including a (meth)acrylic acid ester-based monomer as a polymerization unit, and including a (meth) acrylic polymer component including a first reactive group on a side chain or terminal end thereof and the monomer component; introducing a photoreactive group to the bulk polymerization product by mixing the bulk polymerization product with a compound having a second reactive group capable of reacting with the first reactive group and a photoreactive group; and further mixing a monomer component having a high glass transition temperature in the bulk polymerization product to which the photoreactive group is introduced.

Here, the operation of preparing a bulk polymerization product may include partially polymerizing a monomer mixture including a (meth)acrylic acid ester-based monomer and a copolymerizable monomer having a first reactive group according to a bulk polymerization method, and in another example, may include bulk polymerizing a monomer mixture including a (meth)acrylic acid ester-based monomer and a copolymerizable monomer having a first reactive group and further blending the monomer mixture into the bulk polymerization product.

A kind and a weight ratio of the monomer capable of being used in the polymerization operation are described above.

In addition, the method of bulk polymerizing the monomer mixture is not particularly limited, either, and thus, for example, the monomer mixture may be polymerized by heat or UV rays. In addition, a polymerization degree may be selected in consideration of a desired physical property such as a viscosity of the composition.

The operation of bulk polymerizing the monomer mixture may be terminated by adding oxygen, and a termination speed may be increased by decreasing a temperature or further adding the monomer mixture.

In the present invention, after the polymerization operation, an operation of mixing the polymerized monomer mixture with a compound binding to the reactive group to provide a photoreactive group may be performed, and as needed, an operation of reacting the compound capable of providing the photoreactive group with a first reactive group present in the polymerization product may be further performed. In this case, a condition of the reaction is not particularly limited, and the mixture may be reacted at room temperature to 40° C. at a normal pressure for 4 to 48 hours. Here, the reaction may be performed under the presence of a catalyst such as organic tin.

Subsequently, the solventless composition capable of being used in the manufacture of the substrate film of the present invention may be prepared by further mixing a monomer component having a high glass transition temperature into the reaction product including the (meth)acrylic polymer component into which the photoreactive group is introduced to a side chain or terminal end thereof.

In the present invention, as the film is manufactured by the above-described method, generation of a protrusion such as a fish eye on the film may be prevented, and the film may have a uniform thickness.

A method of casting the solventless composition may be, for example, but is not particularly limited to, bar coating, knife coating, roll coating, spray coating, gravure coating, curtain coating, comma coating, or lip coating according to a desired thickness.

Curing of the casted composition after the casting process may be electromagnetic radiation using, for example, UV rays. In this case, a method of radiating an electromagnetic wave to the composition is not particularly limited, and may employ a means known in the art. For example, when the present invention employs a UV radiation method, a metal halide lamp, a high pressure mercury lamp, a black light lamp, an induction lamp, or a xenon lamp may be used. In addition, here, a condition for radiating UV rays may be selected in consideration of a component ratio of the composition or a desired curing degree without particular limitation.

Still another aspect of the present invention provides a pressure-sensitive adhesive sheet for processing a wafer including a substrate film according to exemplary embodiments of the present invention and a pressure-sensitive adhesive layer formed on one or both surfaces of the substrate film.

The pressure-sensitive adhesive sheet of the present invention may have various uses such as a protective film in processing of a semiconductor wafer, an advertisement film, a cleaning sheet, a reflective sheet, a pressure-sensitive adhesive sheet for a structure, a pressure-sensitive adhesive sheet for a photograph, a pressure-sensitive adhesive sheet for directing a traffic line, an optical pressure-sensitive adhesive product, a pressure-sensitive adhesive product for an electronic part, or a medical patch, and particularly, in the processing of a semiconductor wafer, is used as a surface protective sheet during a back-grinding process, a dicing sheet, or a pick-up sheet.

FIG. 1 is a cross-sectional view of a pressure-sensitive adhesive sheet(1) according to an exemplary embodiment of the present invention. As shown in FIG. 1, the pressure-sensitive adhesive sheet(1) of the present invention includes a substrate film(11) according to the present invention, which is described above, and a pressure-sensitive adhesive layer(12) formed on the substrate film(11). In the present invention, a specific kind of the pressure-sensitive adhesive layer(12) included in the pressure-sensitive adhesive sheet is not particularly limited. In this art, various pressure-sensitive adhesives capable of being used for the pressure-sensitive adhesive sheet for processing a wafer such as a surface protective sheet, a dicing sheet, or a pick-up sheet may be known, and in the present invention, a suitable one of the above-described pressure-sensitive adhesives may be selected without limitation in the present invention. In the present invention, for example, as a pressure-sensitive adhesive layer, a silicon-based pressure-sensitive adhesive, a synthetic rubber-based pressure-sensitive adhesive, a natural rubber-based pressure-sensitive adhesive, or an acrylic pressure-sensitive adhesive may be used. In the present invention, an acrylic pressure-sensitive adhesive, particularly, a pressure-sensitive adhesive including an acrylic polymer crosslinked by a multifunctional crosslinking agent may be used, and more particularly, a pressure-sensitive adhesive including an acrylic polymer crosslinked by a multifunctional crosslinking agent and a photoreactive compound to decrease a pressure-sensitive adhesive strength due to light radiation of a UV ray, but the present invention is not limited thereto.

In addition, in the present invention, a thickness of the pressure-sensitive adhesive layer is not particularly limited either, and may be controlled in a range of approximately 0.5 μm to 60 μm or 1 μm to 40 μm.

In the present invention, the above-described method of manufacturing a pressure-sensitive adhesive sheet is not particularly limited. For example, the above-described method may be sequentially performed, thereby forming the substrate film and then forming a pressure-sensitive adhesive layer, or may include laminating a substrate film prepared separately and a pressure-sensitive adhesive layer.

In addition, as shown in FIG. 2, in a pressure-sensitive adhesive sheet(2) for processing a wafer, a suitable releasing sheet(21) may be further stacked on a pressure-sensitive adhesive layer(12) in terms of preventing the input of impurities into the pressure-sensitive adhesive layer(12).

Yet another aspect of the present invention provides a method of processing a wafer including attaching a pressure-sensitive adhesive sheet for processing a wafer according to the present invention on one surface of a semiconductor wafer; and processing the wafer on which the pressure-sensitive adhesive sheet for processing a wafer is attached.

The method of processing a wafer of the present invention is characterized by using the pressure-sensitive adhesive sheet according to the present invention. For example, in the present invention, the above-described pressure-sensitive adhesive sheet may be laminated on the wafer by pressing or hot roll lamination, and then the wafer may be processed.

In addition, the process of processing a wafer may be dicing, back-grinding, or picking-up, and specific process conditions are not particularly limited.

Advantageous Effects

In the present invention, a substrate film having excellent thermal resistance and dimensional stability can be provided. In addition, the present invention provides a substrate film, which has excellent stress relaxation to prevent damage of a wafer caused by remaining stress, inhibits damage to or flying-off of the wafer caused by application of a non-uniform pressure during the processing of the wafer, and has excellent cuttability. Accordingly, the substrate film of the present invention can be effectively used as a processing sheet in processing of various kinds of wafers including dicing, back-grinding, or picking-up.

Figure 1:
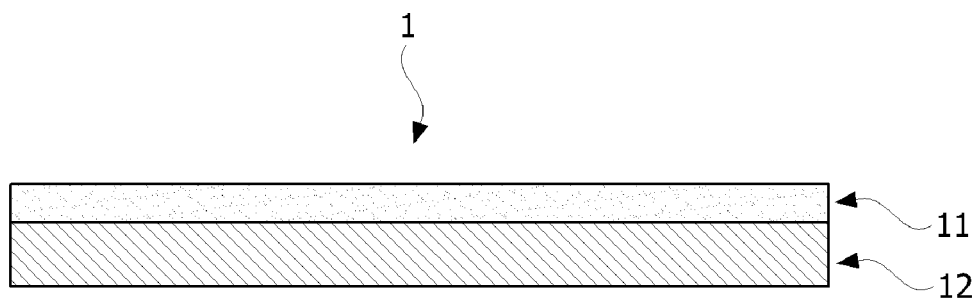
FIGS. 1 to 2 are cross-sectional views of an exemplary pressure-sensitive adhesive sheet for processing a wafer.
Figure 2:
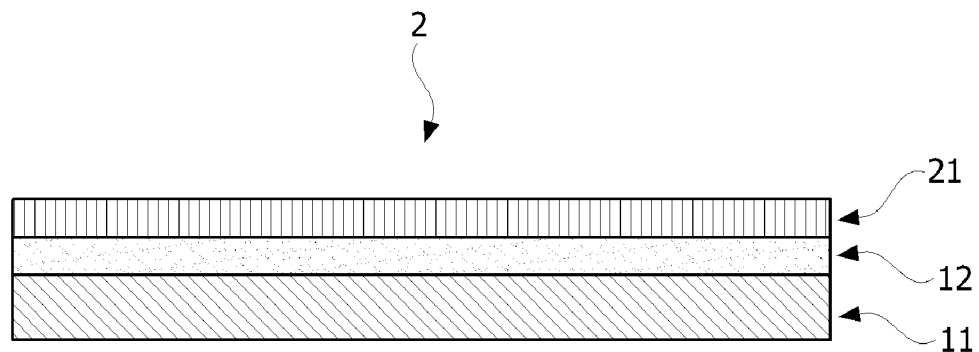

DESCRIPTIONS OF REFERENCE MARKS 1, 2: Pressure-sensitive adhesive sheet for processing wafer
11: Substrate film
12: Pressure-sensitive adhesive layer
21: Releasing sheet

MODE FOR INVENTION

Hereinafter, exemplary embodiments of the present invention will be described in detail. However, the present invention is not limited to the exemplary embodiments disclosed below, but can be implemented in various forms. The exemplary embodiments are provided for complete disclosure of the present invention and to enable those of ordinary skill in the art to embody and practice the present invention.

Example 1

Preparation of Solventless Composition 75 parts by weight of ethylhexyl acrylate (EHA), 20 parts by weight of isobornyl acrylate (IBOA), and 5 parts by weight of hydroxyethyl acrylate (HEA) were input as monomers into a 4-neck glass reaction vessel equipped with a stirrer, a nitrogen gas introduction tube, a temperature sensor, and a condenser. Subsequently, 120 ppm of n-dodecyl mercaptan (n-DDM), which was a chain transfer agent (CTA), and 180 ppm of 2,4-diphenyl-4-methyl-1-pentene (AMSD) were input based on 100 parts by weight of the monomer mixture, and sufficiently mixed at 30° C. for 30 minutes or more while nitrogen was injected into the reaction vessel. Subsequently, a temperature in the reaction vessel was increased to 62° C., and an initiator such as di(2-ethylhexyl)peroxydicarbonate (EHPDC) was input at a concentration of 150 ppm to initiate a reaction. Afterward, when a temperature of a reaction system increased to 80° C. due to heat generated by the reaction, oxygen was input, 20 parts by weight of the monomer mixture (EHA:IBOA:HEA=75:20:5) formed in the same composition as described above was further input based on 100 parts by weight of the monomer mixture initially input thereto, and the temperature was decreased to 30° C. to terminate the reaction, thereby obtaining a first reaction product. The first reaction product included 34% of a high molecular weight product, which had a weight average molecular weight of 600,000 and a glass transition temperature of −43° C.

Subsequently, 1 equivalent weight of 2-methacryloyloxy ethyl isocyanate (MOI) based on 1 equivalent weight of hydroxyethyl acrylate included in the first reaction product and 1 wt % of a catalyst (dibutyl tin dilaurate, DBTDL) based on the weight of the hydroxyethyl acrylate were blended into the first reaction product, and reacted at 40° C. for 24 hours to introduce a photoreactive group to a side chain of the polymer in the first reaction product, thereby obtaining a second reaction product.

Then, 50 parts by weight of an isobornyl acrylate monomer (glass transition temperature: 94° C.) and 1 part by weight of a photoinitiator (Irgacure 819), relative to 100 parts by weight of the monomer mixture initially input were blended, thereby obtaining a solventless composition.

Manufacture of Substrate Film

The solventless composition prepared as described above was coated on a carrier film such as poly(ethylene terephthalate) (PET) to have a thickness of 150 μm using a bar coater, and the PET film was laminated again on the coating layer. Afterward, UV rays (1,000 mJ/cm$^2$) were radiated onto the coating layer using a metal halide lamp while supply of oxygen was interrupted to cure the coating layer, and the PET films on the top and bottom of the coating layer were removed, thereby obtaining a substrate film.

Manufacture of Pressure-Sensitive Adhesive Sheet

A pressure-sensitive adhesive sheet was manufactured by coating a pressure-sensitive adhesive composition on the substrate film manufactured as described above. The pressure-sensitive adhesive composition was a copolymer of EHA and HEA (weight average molecular weight 500,000, glass transition temperature: −32° C.), which was prepared by mixing 5 parts by weight of a TDI-based isocyanate curing agent and 3 parts by weight of a photoinitiator (Irgacure 651) in 100 parts by weight of a photoreactive polymer in which 90 wt % of hydroxyl groups (OH) present on a side chain of the copolymer were substituted with methacryloyloxy methyl isocyanate. Specifically, the pressure-sensitive adhesive composition was coated on a releasing-treated PET film having a thickness of 38 nm to have a thickness of 30 nm after drying, and dried at 110° C. for 3 minutes, thereby forming a pressure-sensitive adhesive layer. The formed pressure-sensitive adhesive layer was laminated on the substrate film manufactured as described above.

Example 2

A process was performed as described in Example 1, except that 100 parts by weight of isobornyl acrylate monomer was blended based on 100 parts by weight of the monomer mixture initially input in Example 1.

Example 3

A process was performed as described in Example 1, except that 200 parts by weight of a cyclo hexyl acrylate monomer (glass transition temperature: 18° C.) was blended with respect to 100 parts by weight of the monomer mixture initially input, instead of the isobornyl acrylate monomer in Example 1.

Example 4

A process was performed as described in Example 1, except that a reaction amount of MOI was changed into 0.5 equivalent weight during mixing of the secondary reaction product in Example 1.

Example 5

A process was performed as described in Example 4, except that a monomer mixture of 73 parts by weight of EHA, 25 parts by weight of IBOA, and 2 parts by weight of HEA was used as a monomer mixture of the primary reaction product in Example 4.

Example 6

A process was performed as described in Example 5, except that 3 parts by weight of hexanediol diacrylate (HDDA), relative to 100 parts by weight of the composition was further blended into the solventless composition prepared in Example 5.

Comparative Example 1

A process was performed as described in Example 1, except that a solventless composition was prepared by directly mixing an isobornyl acrylate monomer and a photoinitiator without performing an operation of reacting the primary reaction product prepared in Example 1 with MOI.

Comparative Example 2

A process was performed as described in Example 1, except that a solventless composition was prepared by only mixing a photoinitiator without an isobornyl acrylate monomer after the secondary reaction product was prepared in Example 1.

Comparative Example 3

A process was performed as described in Example 1, except that 13 parts by weight of an isobornyl acrylate monomer was blended, relative to 100 parts by weight of the monomer mixture initially input thereto in Example 1.

Comparative Example 4

A process was performed as described in Example 1, except that a monomer mixture of 85 parts by weight of ethylhexyl acrylate (EHA) and 15 parts by weight of hydroxyethyl acrylate (HEA) was used as a monomer mixture of the primary reaction product in Example 1, and 33 parts by weight of an isobornyl acrylate monomer, relative to 100 parts by weight of the monomer mixture initially input was blended.

Comparative Example 5

A process was performed as described in Example 1, except that 50 parts by weight of a 2-ethylhexylacrylate monomer (glass transition temperature: −65° C.), relative to 100 parts by weight of the monomer mixture initially input was blended, instead of the isobornyl acrylate in Example 1.

Comparative Example 6

A process was performed as described in Comparative Example 1, except that 3 parts by weight of hexanediol diacrylate (HDDA), relative to 100 parts by weight of the composition was further blended into the solventless composition prepared in Comparative Example 1.

Comparative Example 7

Preparation of Solvent-Type Composition 75 parts by weight of EHA, 20 parts by weight of IBOA, and 5 parts by weight of HEA were mixed in an ethyl acetate solvent to have a concentration of the monomer mixture of 40 wt %. Subsequently, 400 ppm of a CTA such as n-DDM was further blended, and sufficiently mixed at 30° C. for 30 minutes while nitrogen was injected into a 4-neck glass reaction vessel equipped with a stirrer, a nitrogen gas introduction tube, a temperature sensor, and a condenser. Afterward, a temperature in the reaction vessel was increased to 62° C., an initiator such as azobisisobutyronitrile (V-60) was input at a concentration of 300 ppm, and polymerization was performed for 5 hours, thereby obtaining a composition.

Manufacture of Substrate Film

A substrate film was manufactured to have a thickness of 150 nm by blending 3 parts by weight of a TDI-based isocyanate curing agent, relative to 100 parts by weight of the solvent-type composition prepared above, coating the resulting mixture on a carrier film, which was a PET film, using a bar coater, and drying the coating layer at 110° C. for 3 minutes.

Manufacture of Pressure-Sensitive Adhesive Sheet

A pressure-sensitive adhesive sheet was manufactured by coating a pressure-sensitive adhesive composition on the substrate film manufactured above. The manufacture of the pressure-sensitive adhesive sheet was performed as described in Example 1.

Experimental Example

1. Measurement of Coatability

The presence of linear patterns or bubbles on the surface of the substrate film manufactured in one of Examples 1 to 6 and Comparative Examples 1 to 7 was observed with the naked eye, and the results are shown in Tables 1 and 2.

○: no linear patterns or bubbles (excellent coatability)
x: linear patterns or bubbles (poor coatability)

2. Measurement of Haze

The substrate films manufactured according to Examples 1 to 6 and Comparative Examples 1 to 7 were observed with the naked eye to determine the presence of a haze, and results are shown in Tables 1 and 2.

○: the film was transparent
x: the film was not transparent

3. Measurement of Glass Transition Temperature (Tg)

A glass transition temperature of each of the substrate films manufactured according to Examples 1 to 6 and Comparative Examples 1 to 7 was measured using a DSC thermogravimetric system, and results are shown in Tables 1 and 2.

4. Measurement of Toughness

Toughness was measured with respect to each of the substrate films manufactured according to Examples 1 to 6 and Comparative Examples 1 to 7 using a tensile tester. Particularly, a sample was manufactured by cutting the substrate film to have a size of 15 mm×15 mm (width×length). Here, the size of the width and length was a size excluding a taped part of the sample to be fixed to the tensile tester. The sample was fixed to the tensile tester by taping, and extended in a vertical direction at room temperature (about 15° C. to 30° C.) and at a speed of 200 mm/min, and then a force according to a distance until the sample was cut was measured, and a graph was drawn. From the drawn graph, an area of a tensile curve was integrated, thereby measuring toughness, and results are shown in Tables 1 and 2.

5. Measurement of Modulus

A modulus was measured with respect to each of the substrate films manufactured in Examples 1 to 6 and Comparative Examples 1 to 7 using a tensile tester. Particularly, a sample was manufactured by cutting the substrate film to have a size of 15 mm×15 mm (width×length). Here, the size of the width and length was a size excluding a taped part of the sample to be fixed to the tensile tester. The sample was fixed to the tensile tester by taping, and extended in a vertical direction at room temperature (about 15° C. to 30° C.) and at a speed of 200 mm/min, and then a force according to a distance until the sample was cut was measured, and a graph was drawn. From the drawn graph, an initial slope of a tensile curve was measured, and results are shown in Tables 1 and 2.

6. Measurement of Gel Fraction

A gel fraction of each of the substrate films manufactured according to Examples 1 to 6 and Comparative Examples 1 to 7 was measured by the following method. The manufactured substrate film was cut into a size of 4 cm×4 cm to measure a weight (A of Equation 1), and immersed in ethyl acetate at room temperature (about 25° C.) for 24 hours. Afterward, an insoluble substrate was taken and dried at 150° C. for 30 minutes, and ethyl acetate present in the insoluble content was removed. Then, a weight of the resulting material (B of Equation 1) was measured. Subsequently, the measured weight was assigned to Equation 1, and results are shown in Tables 1 and 2.

TABLE 1

|  |  | Example |  |  |  |  |  |
|---|---|---|---|---|---|---|---|
|  |  | 1 | 2 | 3 | 4 | 5 | 6 |
| Monomer composition of primary reaction product | EHA | 75 | 75 | 75 | 75 | 73 | 73 |
|  | IBOA | 20 | 20 | 20 | 20 | 25 | 25 |
|  | HEA | 5 | 5 | 5 | 5 | 2 | 2 |
| Equivalent weight of photoreactive group |  | 1 | 1 | 1 | 0.5 | 0.5 | 0.5 |
| High Tg monomer (content) |  | IBOA (50) | IBOA (50) | CHA (200) | IBOA (50) | IBOA (50) | IBOA (50) |
| HDDA |  | — | — | — | — | — | 3 |
| Coatability |  | ○ | ○ | ○ | ○ | ○ | ○ |
| Haze |  | ○ | ○ | ○ | ○ | ○ | ○ |
| Glass transition temperature (° C.) |  | −11 | 18 | −5 | −11 | −11 | −7 |
| Toughness (Kg·mm) |  | 60 | 35 | 54 | 68 | 120 | 65 |
| Modulus (MPa) |  | 110 | 185 | 95 | 103 | 65 | 74 |
| Gel fraction (%) |  | 95 | 93 | 93 | 93 | 92 | 97 |

EHA: 2-ethylhexylacrylate,
IBOA: isobornyl acrylate,
CHA: cyclohexyl acrylate,
HEA: 2-hydroxyethylacrylate, equivalent weight of photoreactive group: an equivalent weight ratio based on an equivalent weight of a copolymerizable monomer (HEA) having a reactive group,
HDDA: parts by weight of hexanediol diacrylate, relative to 100 parts by weight of the composition

TABLE 2

|  |  | Comparative Example |  |  |  |  |  |  |
|---|---|---|---|---|---|---|---|---|
|  |  | 1 | 2 | 3 | 4 | 5 | 6 | 7 |
| Monomer composition of primary reaction product | EHA | 75 | 75 | 75 | 85 | 75 | 75 | 75 |
|  | IBOA | 20 | 20 | 20 | — | 20 | 20 | 20 |
|  | HEA | 5 | 5 | 5 | 15 | 5 | 5 | 5 |

TABLE 2-continued

| | Comparative Example | | | | | | |
|---|---|---|---|---|---|---|---|
| | 1 | 2 | 3 | 4 | 5 | 6 | 7 |
| Equivalent weight of photoreactive group | — | 1 | 1 | 1 | 1 | — | — |
| High Tg monomer (content) | IBOA (50) | — | IBOA (13) | IBOA (33) | — | IBOA (50) | — |
| Low Tg monomer (content) | — | — | — | — | EHA (50) | — | — |
| TDI curing agent | — | — | — | — | — | — | 3 |
| HDDA | — | — | — | — | — | 3 | — |
| Coatability | ○ | ○ | ○ | ○ | ○ | ○ | x |
| Haze | x | ○ | ○ | ○ | ○ | x | ○ |
| Glass transition temperature (° C.) | −11 | −43 | −34 | −30 | −49 | −11 | −43 |
| Toughness (Kg · mm) | 8 | N.M. | N.M. | N.M. | N.M. | 7 | N.M. |
| Modulus (MPa) | 98 | N.M. | N.M. | N.M. | N.M. | 120 | N.M. |
| Gel fraction (%) | 2 | 93 | 93 | 93 | 94 | 78 | 91 |

*N.M.: not measured; impossible to perform a tensile test since molding was not proper as a substrate As seen from the results of Tables 1 and 2, all of the substrate films of Examples according to the present invention had excellent coatability and film formability, and particularly, even though a film having a large thickness of 150 nm was manufactured, the film had excellent coatability and did not have a haze.

In contrast, in Comparative Examples 1 and 6, since a photoreactive group was not present, a haze was generated in the film due to phase separation in the manufacture of the film, and in Comparative Examples 2 to 5, due to a low glass transition temperature, the film did not have satisfactory physical properties, and could not be used as a substrate film. In addition, in Comparative Example 7, when the composition was coated to a large thickness of 150 nm, it was confirmed that bubbles were generated in the coating layer.

In addition, the substrate film according to Examples had a high gel fraction of 80% or more, thereby having excellent thermal resistance, was optically transparent, and could sufficiently serve as a substrate. On the other hand, in Comparative Examples, since the film could not have a high gel fraction, the thermal resistance was significantly decreased, and thus the film was difficult to use as a substrate, or even though the film had a high gel fraction, due to a low glass transition temperature, the film could not serve as a substrate.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A substrate film, which has a toughness of 10 Kg·mm to 250 Kg·mm at 23° C. comprising a cured product of a solventless composition, wherein the solventless composition comprises:
a (meth)acrylic polymer component comprising a (meth)acrylic acid ester-based monomer as a polymerization unit, and having a photoreactive group on a side chain or terminal end thereof; and
a component of a monomer having a high glass transition temperature,
wherein the cured product has a glass transition temperature of −20° C. (250K) or more, and wherein the substrate film has a modulus of 10 MPa to 200 MPa.

2. The substrate film of claim 1, wherein the (meth)acrylic polymer component has a low glass transition temperature, and is comprised in a solventless composition in a partially polymerized state before curing.

3. The substrate film of claim 1, wherein the (meth)acrylic polymer component comprises a bulk polymerization product of a monomer mixture comprising a (meth)acrylic acid ester-based monomer and a copolymerizable monomer having a first reactive group, and a compound providing a photoreactive group in state bound with the first reactive group in the bulk polymerization product.

4. The substrate film of claim 3, wherein the (meth)acrylic acid ester-based monomer comprises (meth)acrylic acid alkyl ester.

5. The substrate film of claim 3, wherein the first reactive group is at least one selected from the group consisting of a hydroxyl group, a carboxyl group, an isocyanate group, an amino group and an epoxy group.

6. The substrate film of claim 3, wherein the monomer mixture comprises 70 to 99 parts by weight of the (meth) acrylic acid ester-based monomer and 1 to 30 parts by weight of the copolymerizable monomer having a first reactive group.

7. The substrate film of claim 3, wherein the compound providing a photoreactive group is at least one compound selected from the group consisting of a compound of Formula 1; a compound of Formula 2; a compound of Formula 3; a reaction product of a multifunctional isocyanate compound and a compound of Formula 4; and a reaction product of a multifunctional isocyanate compound, a polyol compound, and a compound of Formula 4:

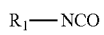

[Formula 1]

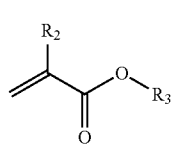

[Formula 2]

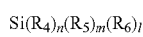

[Formula 3]

-continued

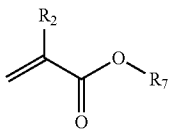

[Formula 4]

where $R_1$ is an alkyl group substituted with a (meth)acryloxy group, a (meth)acryloxyalkyl group or an alkenylphenyl group; a (meth)acryloyl group; a (meth)acryloxy group; or an alkenyl group, $R_2$ is hydrogen or an alkyl group, $R_3$ is hydrogen or a glycidyl group, $R_4$ is a (meth)acryloxyalkyl group, $R_5$ is a halogen atom, $R_6$ is an alkyl group, n+m+l is 4, n and m are each independently 1 to 3, and $R_7$ is a hydroxyalkyl group.

8. The substrate film of claim 3, wherein the compound providing a photoreactive group is comprised at 1 to 200 equivalent weight, relative to 100 equivalent weight of the reactive group in the polymerization product.

9. The substrate film of claim 1, wherein the photoreactive group is a (meth)acryloyl group.

10. The substrate film of claim 1, wherein the monomer component having a high glass transition temperature is a monomer having a glass transition temperature of 20° C. to 100° C.

11. The substrate film of claim 1, wherein the (meth)acrylic polymer component is a monomer having a glass transition temperature of −50° C. to 0° C.

12. The substrate film of claim 1, wherein the monomer component having a high glass transition temperature is at least one selected from the group consisting of isobornyl acrylate, cyclohexyl acrylate, methylmethacrylate and styrene.

13. The substrate film of claim 1, wherein the monomer component having a high glass transition temperature includes 35 to 300 parts by weight, relative to 100 parts by weight of the (meth)acrylic polymer component.

14. The substrate film of claim 1, wherein the solventless composition further comprises a multifunctional acrylate or an acrylate-based oligomer.

15. The substrate film of claim 14, wherein the multifunctional acrylate or the acrylate-based oligomer is comprised at 500 parts by weight or less, relative to 100 parts by weight of the (meth)acrylic polymer component.

16. The substrate film of claim 1, wherein the solventless composition further comprises a photoinitiator.

17. The substrate film of claim 1, which has a gel fraction of 80% to 100%.

18. A method of manufacturing a substrate film, which has a toughness of 10 Kg·mm to 250 Kg·mm at 23° C., comprising:

casting a solventless composition comprising:
a (meth)acrylic polymer component comprising a (meth)acrylic acid ester-based monomer as a polymerization unit, and having a photoreactive group on a side chain or terminal end thereof and a component of the monomer having a high glass transition temperature; and
curing the casted solventless composition to form a cured product, wherein the cured product has a glass transition temperature of −20° C. (250K) or more, and wherein the substrate film has a modulus of 10 MPa to 200 MPa.

19. The method of manufacturing a substrate film of claim 18, wherein the solventless composition is casted by bar coating, knife coating, roll coating, spray coating, gravure coating, curtain coating, comma coating or lip coating.

20. The method of manufacturing a substrate film of claim 18, wherein the solventless composition is provided by preparing a bulk polymerization product comprising a (meth)acrylic acid ester-based monomer as a polymerization unit, and comprising a (meth)acrylic polymer component having a first reactive group on a side chain or terminal end thereof and the monomer component;
introducing a photoreactive group to the bulk polymerization product by mixing the bulk polymerization product with a compound having a second reactive group capable of reacting with the first reactive group and a photoreactive group; and
mixing further a monomer component having a high glass transition temperature in the bulk polymerization product introduced the photoreactive group.

21. The method of manufacturing a substrate film of claim 20, wherein the operation of preparing a bulk polymerization product comprises partially polymerizing a monomer mixture comprising a (meth)acrylic acid ester-based monomer and a copolymerizable monomer having a first reactive group.

22. A pressure-sensitive adhesive sheet for processing a wafer, comprising:
a substrate film according to claim 1; and
a pressure-sensitive adhesive layer formed on one or both surfaces of the substrate film.

23. A method of processing a wafer, comprising:
attaching the pressure-sensitive adhesive sheet for processing a wafer according to claim 22 to one surface of a semiconductor wafer; and
processing a wafer attached the pressure-sensitive adhesive sheet for processing a wafer.

24. The method of processing a wafer of claim 23, wherein the operation of processing a wafer is back-grinding or dicing.

* * * * *